(12) United States Patent
Chung

(10) Patent No.: US 11,488,680 B2
(45) Date of Patent: Nov. 1, 2022

(54) TEST SYSTEM INCLUDING MEMORY DEVICES

(71) Applicant: SK hynix Inc., Icheon-si (KR)

(72) Inventor: Seung Hyun Chung, Icheon-si (KR)

(73) Assignee: SK hynix Inc., Icheon-si (KR)

(*) Notice: Subject to any disclaimer, the term of this patent is extended or adjusted under 35 U.S.C. 154(b) by 7 days.

(21) Appl. No.: 17/187,258

(22) Filed: Feb. 26, 2021

(65) Prior Publication Data

US 2022/0068418 A1 Mar. 3, 2022

(30) Foreign Application Priority Data

Aug. 31, 2020 (KR) .................. 10-2020-0110537

(51) Int. Cl.
*G11C 29/14* (2006.01)
*G11C 29/12* (2006.01)

(52) U.S. Cl.
CPC ........ *G11C 29/14* (2013.01); *G11C 29/12005* (2013.01)

(58) Field of Classification Search
CPC .... G11C 29/14; G11C 29/12005; G11C 29/46
USPC ....................................................... 714/718
See application file for complete search history.

(56) References Cited

U.S. PATENT DOCUMENTS

2010/0322007 A1* 12/2010 Jeon ................ G11C 11/5642
365/185.18
2018/0075919 A1* 3/2018 Pang ................ H01L 27/11582

FOREIGN PATENT DOCUMENTS

KR 1020170136829 A 12/2017
KR 1020190000663 A 1/2019

* cited by examiner

*Primary Examiner* — James C Kerveros
(74) *Attorney, Agent, or Firm* — William Park & Associates Ltd.

(57) ABSTRACT

The present technology includes a test system. The test system includes a memory device configured to store an initial setting value for performing normal operations, and a test device configured to generate an operation command set including a test value that is a result of a test operation of the memory device, and configured to transmit the operation command set to the memory device. The memory device performs an operation by using the test value based on the operation command set, replaces the initial setting value with an operation value that is generated as a result of the operation, and stores the operation value.

18 Claims, 17 Drawing Sheets

FIG. 10

| REG# | INT_VAL# | Descriptor |
|---|---|---|
| REG01 | INT_VAL_01 | |
| REG02 | INT_VAL_02 | |
| REG03 | INT_VAL_03 | start Vpgm |
| REG04 | INT_VAL_04 | |
| REG05 | INT_VAL_05 | |
| REG06 | INT_VAL_06 | |
| REG07 | INT_VAL_07 | mask |
| REG08 | INT_VAL_08 | |
| REG09 | INT_VAL_09 | |
| REG10 | INT_VAL_10 | Vpass |
| REG11 | INT_VAL_11 | |
| REG12 | INT_VAL_12 | |
| ⋮ | ⋮ | ⋮ |

Addresses: AD01–AD12 correspond to REG01–REG12. 530

TEST SYSTEM INCLUDING MEMORY DEVICES

CROSS-REFERENCE TO RELATED APPLICATION

The present application claims priority under 35 U.S.C. § 119(a) to Korean patent application number 10-2020-0110537, filed on Aug. 31, 2020, in the Korean Intellectual Property Office, the entire disclosure of which is incorporated herein by reference.

BACKGROUND

1. Technical Field

The present disclosure relates to a test system including memory devices, and more particularly, to a test system including memory devices each including an operating component.

2. Related Art

A memory device may include a memory cell array in which data is stored, a peripheral circuit that is configured to program, read, or erase memory cells that are included in the memory cell array, and a control circuit that is capable of controlling the peripheral circuit based on a command.

In a manufacturing step of the memory device, various initial setting values that perform the program, read, and erase operations are stored in the memory device. For example, the initial setting values may be a default value for a start program voltage, a step voltage, and a pass voltage.

After manufacturing of the memory device is completed, a test operation on the memory device may be performed, and a test result value may be reflected on the initial setting value stored in the memory device according to a result of the test operation. To this end, a test device may be used.

In order to reflect the test result value on the initial setting value, the test device may perform a read operation to obtain the initial setting value from the memory device, an operation of operating the initial setting value and the test result value, and a storage operation for storing the operated setting value in the memory device.

However, when a plurality of memory devices to which the test value is to be reflected are present, since the above-described operations are required to be performed for each memory device, an operation time for reflecting the test value may increase.

SUMMARY

A test system according to an embodiment of the present disclosure includes a memory device configured to store an initial setting value for performing normal operations, and a test device configured to generate an operation command set, the operation command including a test value that is a result of a test operation of the memory device, and configured to transmit the operation command set to the memory device, wherein the memory device performs an operation by using the test value based on the operation command set, replaces the initial setting value with an operation value that is generated as a result of the operation, and stores the operation value.

A test system according to another embodiment of the present disclosure includes a command generator configured to output an operation command based on different operation enable signals, an address selector configured to output an address of a register in which an initial setting value to be changed is stored, a merge circuit configured to output an operation command set including the operation command, the address, and a test value, when the test value is received, and a memory device configured to generate an operation value by performing an operation based on the operation command set and configured to replace an initial setting value stored in the register with the operation value.

BRIEF DESCRIPTION OF THE DRAWINGS

FIG. 10 is a diagram, specifically illustrating the register group, according to another embodiment of the present disclosure.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

An embodiment of the present disclosure provides a test system capable of rapidly operating a test result value and an initial setting value and rapidly storing an operation value generated by the operation in memory devices.

According to the present technology, a plurality of memory devices operate the test value and the initial setting value according to the operation command set output from the test device, and independently store the operation value generated by the operation. Therefore, a time required to change the initial setting values stored in the plurality of memory devices may be shortened.

Figure 1:
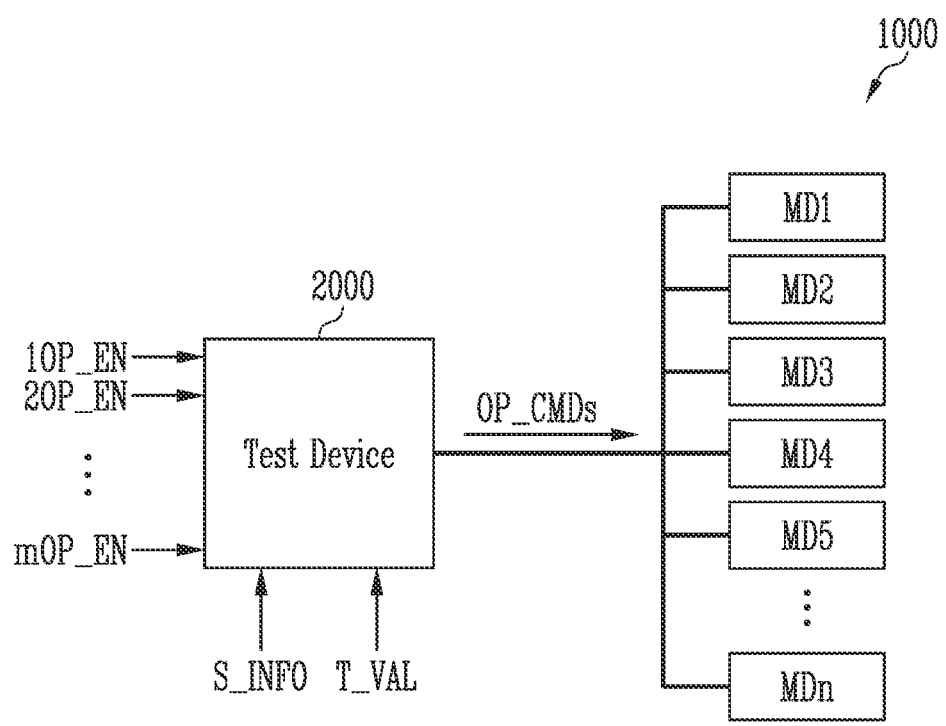
FIG. 1 is a diagram, illustrating a test system, according to an embodiment of the present disclosure.

FIG. 1 is a diagram, illustrating a test system, according to an embodiment of the present disclosure.

Referring to FIG. 1, the test system 1000 may include a plurality of memory devices MD1 to MDn (n is a positive integer) and a test device 2000. Although the plurality of memory devices MD1 to MDn are shown in FIG. 1, one memory device may be connected to the test device 2000.

The memory devices MD1 to MDn may be devices that are capable of storing data, and may be configured of a non-volatile memory device or a volatile memory device. The non-volatile memory device may be a device in which stored data is maintained even though power supply is cut off, and the volatile memory device may be a device in which stored data is destroyed when the power supply is cut off.

The test device 2000 may output an operation command set OP_CMDs based on first to m-th operation enable signals 1OP_EN to mOP_EN (m is a positive integer), setting value type information S_INFO, and a test value T_VAL. The test device 2000 might not operate the test value T_VAL and may output the operation command set OP_CMDs with the test value T_VAL.

The memory devices MD1 to MDn may simultaneously perform an operation of operating an initial setting value and the test value T_VAL based on the operation command set OP_CMDs and then simultaneously store the operated value. The initial setting values that are stored in different memory devices MD1 to MDn may be different from each other or may be identical to each other. On the other hand, some of the initial setting values may be identical to each other while the rest of the values may be different from each other.

Since the test device 2000, according to the present embodiment, might not perform the operation independently, and the memory devices MD1 to MDn may perform the operation independently, the time required for an operation of reflecting the test value T_VAL on the memory devices MD1 to MDn may be shortened.

Figure 2:
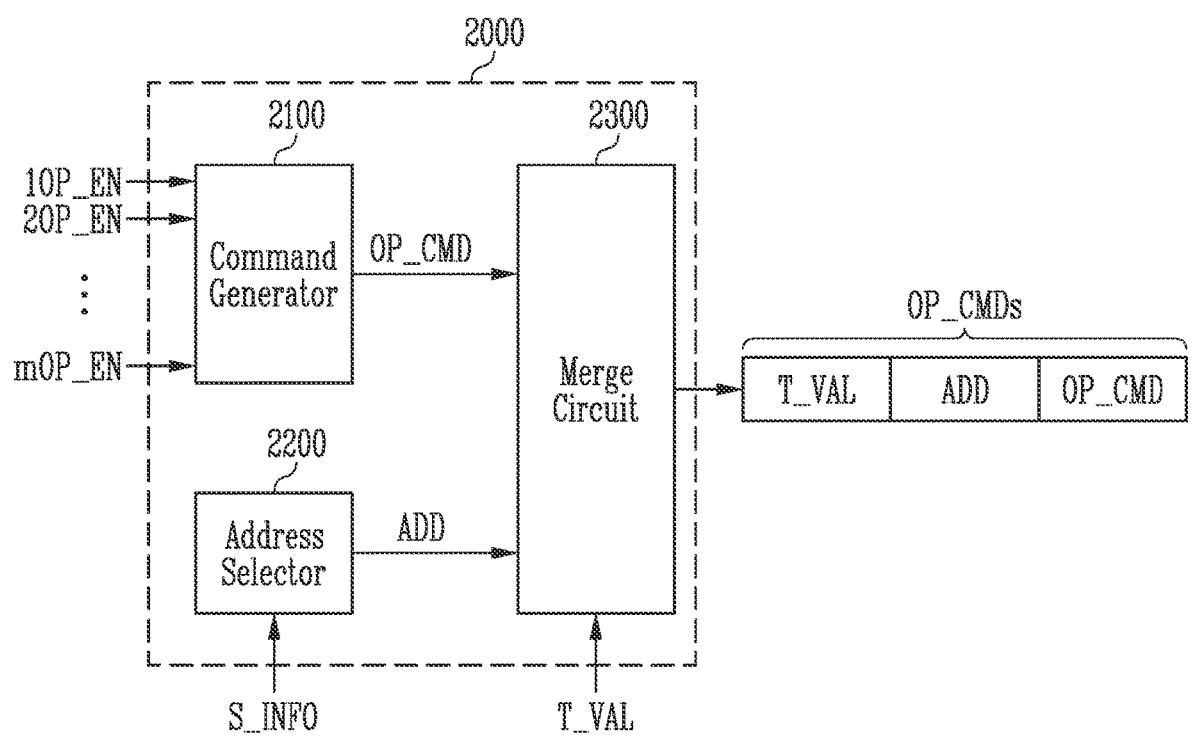
FIG. 2 is a diagram, illustrating a test device, according to an embodiment of the present disclosure.

FIG. 2 is a diagram, illustrating the test device, according to an embodiment of the present disclosure.

Referring to FIG. 2, the test device 2000 may include a command generator 2100, an address selector 2200, and a merge circuit 2300.

The command generator 2100 may output an operation command OP_CMD that corresponds to a selected operation based on the first to m-th operation enable signals 1OP_EN to mOP_EN. The respective first to m-th operation enable signals 1OP_EN to mOP_EN may be signals that correspond to different operations. Here, the operation may be a logical operation, such as AND, OR, or XOR operation. For example, the first operation enable signal 1OP_EN may be a signal that corresponds to an AND logic operation, and the second operation enable signal 2OP_EN may be a signal that corresponds to an OR logic operation. Alternatively, the operation may be an arithmetic operation, such as an addition, subtraction, multiplication, or division operation. The command generator 2100 may output the operation command OP_CMD that corresponds to a selected logical operation based on the input first to m-th operation enable signals 1OP_EN to mOP_EN. The first to m-th operation enable signals 1OP_EN to mOP_EN may be signals that select different logical operations, and may be determined according to a result of a test operation. For example, when the AND operation is required to be performed on the initial setting value and the test value T_VAL based on the result of the test operation of the first to n-th memory devices MD1 to MDn, the first operation enable signal 1OP_EN may be activated and all of the remaining second to m-th operation enable signals 2OP_EN to mOP_EN may be deactivated. The command generator 2100 may output the operation command OP_CMD that corresponds to the activated signal among the first to m-th operation enable signals 1OP_EN to mOP_EN.

The address selector 2200 may output an address ADD based on the setting value type information S_INFO. The setting value type information S_INFO may be a type of a change target value that is selected based on a test result. For example, the type of the change target value may include a start program voltage, a step voltage, a pass voltage, a read voltage, an erase voltage, and the like. Therefore, the setting value type information S_INFO may be information on any one of the start program voltage, the step voltage, the pass voltage, the read voltage, and the erase voltage. In addition, the setting value type information S_INFO may be information regarding any one of various values that are required for various operations of the memory device.

The address selector 2200 may store addresses that correspond to various setting values and may output the address ADD that corresponds to the input setting value type information S_INFO. Here, the address ADD may be an address of registers, among registers that are included in the memory devices, in which the initial setting values are stored.

When the test value T_VAL is input, the merge circuit 2300 may merge the operation command OP_CMD, the address ADD, and the test value T_VAL into one operation command set OP_CMDs and may output the operation command set OP_CMDs. Here, the test value T_VAL may be a value calculated based on the result of the test operation of the memory devices and may be a value for changing the initial setting value that is stored in the memory device. When the operation command OP_CMD, the address ADD, and the test value T_VAL are input, the merge circuit 2300 may merge the input operation command OP_CMD, address ADD, and test value T_VAL into one operation command set OP_CMDs and may output the operation command set OP_CMDs. For example, the operation command OP_CMD, the address ADD, and the test value T_VAL that are included in the operation command set OP_CMDs may be sequentially output through an output line of the merge circuit 2300.

Figure 3:
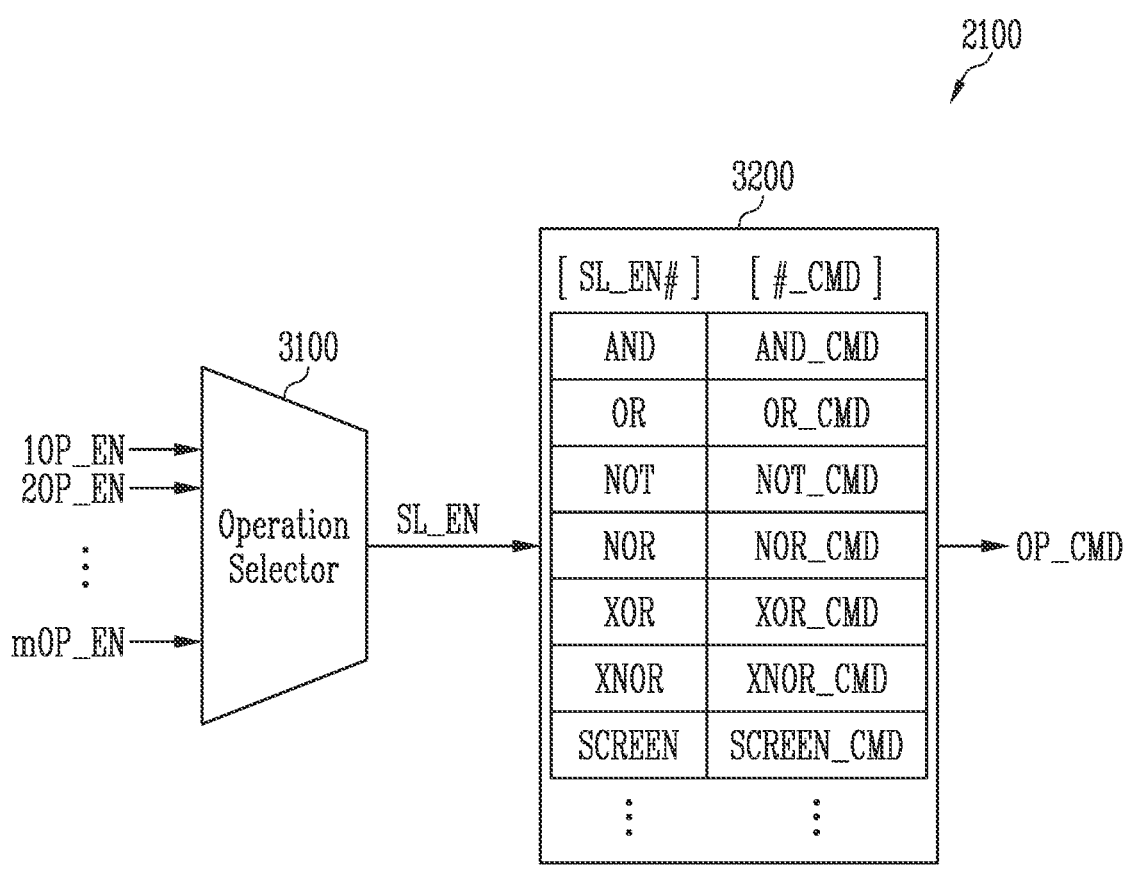
FIG. 3 is a diagram, illustrating a command generator, according to an embodiment of the present disclosure.

FIG. 3 is a diagram, illustrating the command generator, according to an embodiment of the present disclosure.

Referring to FIG. 3, the command generator 2100 may include an operation selector 3100 and an operation command register 3200.

The operation selector 3100 may output a selected enable signal SL_EN based on the first to m-th operation enable signals 1OP_EN to mOP_EN. For example, the operation selector 3100 may be configured of a multiplexer. When the first to m-th operation enable signals 1OP_EN to mOP_EN are input, the operation selector 3100 may output an activated signal, among the input signals, as the selected enable signal SL_EN. Alternatively, the operation selector 3100 may be configured to output the enable signal SL_EN that is selected based on a combination of the input first to m-th operation enable signals 1OP_EN to mOP_EN.

The operation command register 3200 may include a table with various operation commands #_CMD that correspond to selected enable signals SL_EN#. When the selected enable signal SL_EN is input, the operation command register 3200 may output an operation command #_CMD that corresponds to the selected enable signal SL_EN input among the selected enable signals SL_EN# of the table. For example, when the selected enable signal SL_EN that corresponds to the AND operation is received, the operation command register 3200 may output an AND operation command AND_CMD that corresponds to the AND operation from the table as the operation command OP_CMD. As another example, when the selected enable signal SL_EN that corresponds to the XOR operation is received, the operation command register 3200 may output an XOR operation command XOR_CMD that corresponds to the XOR operation from the table as the operation command OP_CMD.

Figure 4:
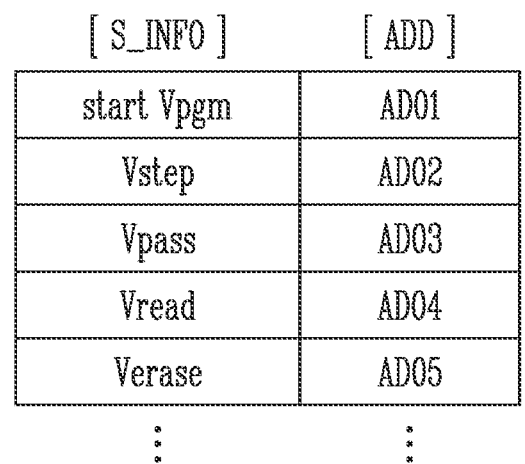
FIG. 4 is a diagram, illustrating an address selector, according to an embodiment of the present disclosure.

FIG. 4 is a diagram, illustrating the address selector, according to an embodiment of the present disclosure.

Referring to FIG. 4, the address selector 2200 may include a table of the addresses ADD that correspond to various setting value type information S_INFO. The setting value type information S_INFO may be information on the initial setting values that are stored in the memory device. For example, the setting value type information S_INFO may include a start program voltage start Vpgm, a step voltage Vstep, a pass voltage Vpass, a read voltage Vread, and an erase voltage Verase, and the like. Different address ADD may be allocated to respective setting value type information S_INFO. For example, a first address AD01 may be allocated to the start program voltage start Vpgm, and a second address AD02 may be allocated to the step voltage Vstep. When the setting value type information S_INFO is received, the address selector 2200 may output the address ADD that is allocated to the received setting value type information S_INFO. For example, the address selector 2200 may output the first address AD01 that is allocated to the start program voltage start Vpgm when the setting value type information S_INFO that corresponds to the start program voltage start Vpgm is received.

Figure 5:
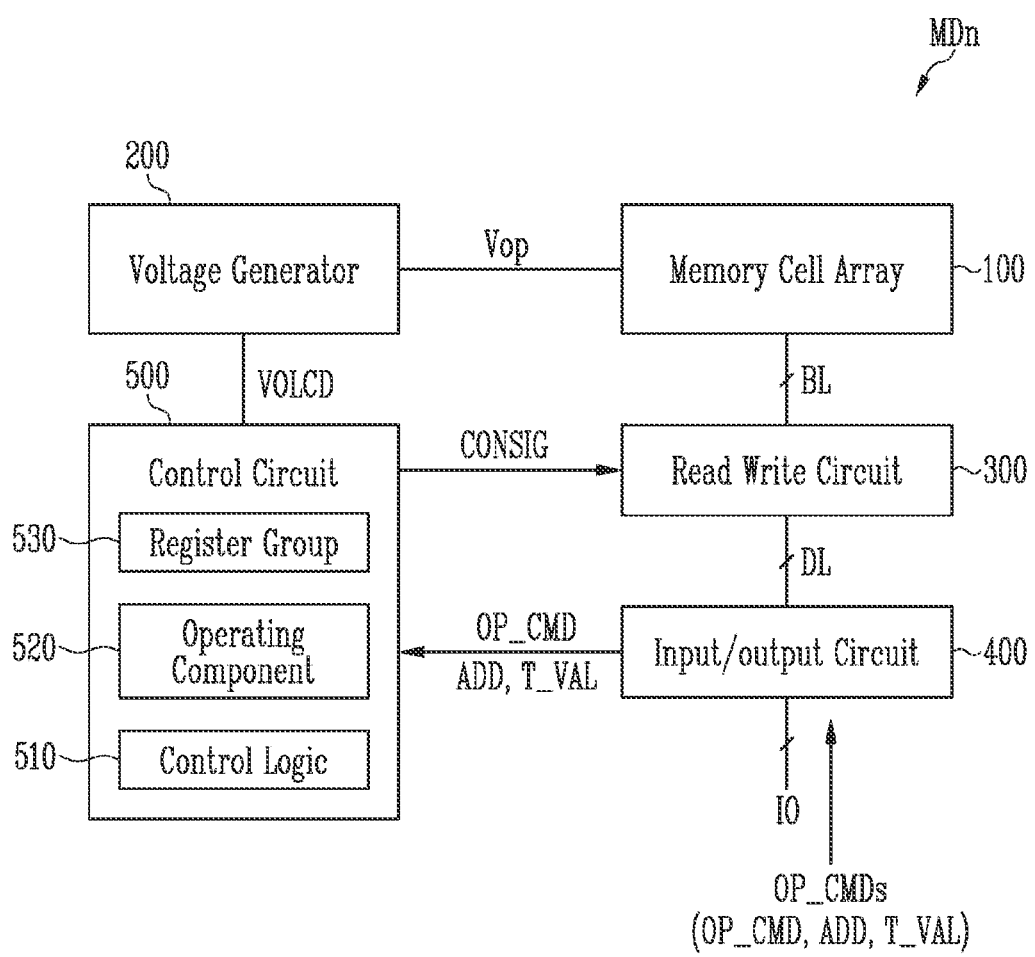
FIG. 5 is a diagram, illustrating a memory device, according to an embodiment of the present disclosure.

FIG. 5 is a diagram, illustrating the memory device, according to an embodiment of the present disclosure.

Referring to FIG. 5, since the first to n-th memory devices MD1 to MDn, shown in FIG. 1, may be configured identically to each other, the n-th memory device MDn is shown in FIG. 5 as an embodiment.

The n-th memory device MDn may include a memory cell array 100, a voltage generator 200, a read write circuit 300, an input output circuit 400, and a control circuit 500.

The memory cell array 100 may include a plurality of memory blocks, and each of the plurality of memory blocks may include a plurality of memory cells.

The voltage generator 200 may output various operation voltages Vop based on a voltage code VOLCD. For example, the voltage generator 200 may generate the program voltage, the pass voltage, the read voltage, or the erase voltage based on the voltage code VOLCD and may output the generated voltage as the operation voltage Vop.

The read write circuit 300 may store data input from an external device through data lines DL and may sense data of the memory cells through bit lines BL based on a control signal CONSIG.

The input output circuit 400 may be connected to an external device through input output lines IO and may receive the operation command set OP_CMDs from the external device through the input output lines IO. Here, the external device may be the test device 2000 of FIG. 1. The operation command set OP_CMDs may include the operation command OP_CMD, the address ADD, and the test value T_VAL. When the operation command set OP_CMDs is received, the input output circuit 400 may transmit the operation command OP_CMD, the address ADD, and the test value T_VAL that are included in the operation command set OP_CMDs to the control circuit 500.

The control circuit 500 may output the voltage code VOLCD and the control signal CONSIG based on a command output from the input output circuit 400. However, when the operation command OP_CMD is received, the control circuit 500 might not output the voltage code VOLCD and the control signal CONSIG, and may store a setting value by performing an internal operation. To this end, the control circuit 500 may include a control logic 510, an operating component 520, and a register group 530.

The control logic 510 may select a logical operation logic based on the operation command OP_CMD. The operating component 520 may receive the address ADD and the test value T_VAL, and may perform an operation based on the selected logical operation logic. The register group 530 may store the initial setting value and may store an operation value that is generated by the operating component 520.

The control circuit 500 may perform a program, read, or erase operation by using the operation value that is stored in the register group 530. The control circuit 500 is more specifically described as follows.

Figure 6:
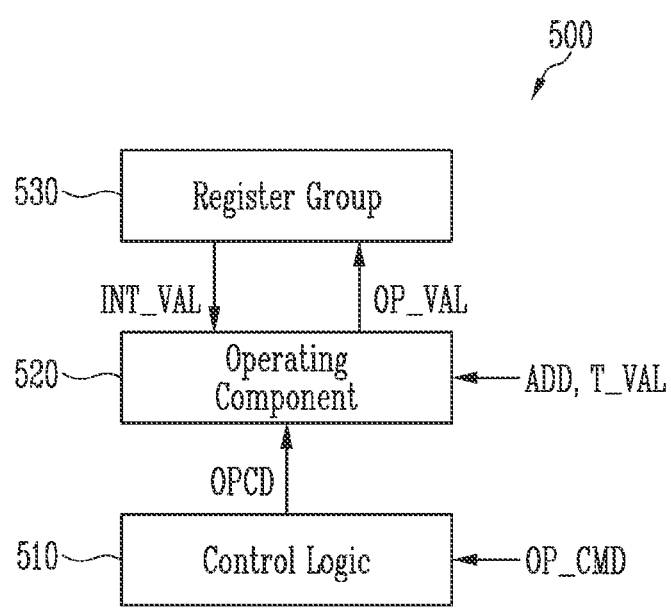
FIG. 6 is a diagram, specifically illustrating a control circuit, according to an embodiment of the present disclosure.

FIG. 6 is a diagram, specifically illustrating the control circuit, according to an embodiment of the present disclosure.

Referring to FIG. 6, the control circuit 500 may include the control logic 510, the operating component 520, and the register group 530.

The control logic 510 may output the operation code OPCD based on the operation command OP_CMD. The operation code OPCD may be a code with a plurality of bits, and a code that corresponds to the input operation command OP_CMD may be output as the operation code OPCD. For example, when the operation command OP_CMD is a command that corresponds to the AND operation, the control logic 510 may output the operation code OPCD to perform the AND operation.

The operating component 520 may select an operation algorithm based on the operation code OPCD and may perform an operation by using the address ADD and the test value T_VAL based on the selected operation algorithm. For example, when the operation code OPCD, the address ADD, and the test value T_VAL are input, the operating component 520 may receive an initial setting value INT_VAL that corresponds to the address ADD from the register group 530, may operate the initial setting value INT_VAL and the test value T_VAL based on the selected algorithm, and may generate an operation value OP_VAL. The operating component 520 may output the operation value OP_VAL that is generated by the operation to the register group 530.

The register group 530 may include a plurality of registers in which the initial setting values INT_VALs are stored. Different addresses may be allocated to the plurality of registers, respectively. Therefore, the register group 530 may output the initial setting value INT_VAL that corresponds to the address ADD that is requested by the operating component 520 and may store the operation value OP_VAL that is output from the operating component 520 in a register that corresponds to the address ADD. That is, when the operation value OP_VAL is input, the register group 530 may replace the initial setting value INT_VAL with the operation value OP_VAL and may store the operation value OP_VAL. The operation value OP_VAL that is stored in the register group 530 may be used as various setting values during a normal operation after the test operation of the memory device.

Figure 7:
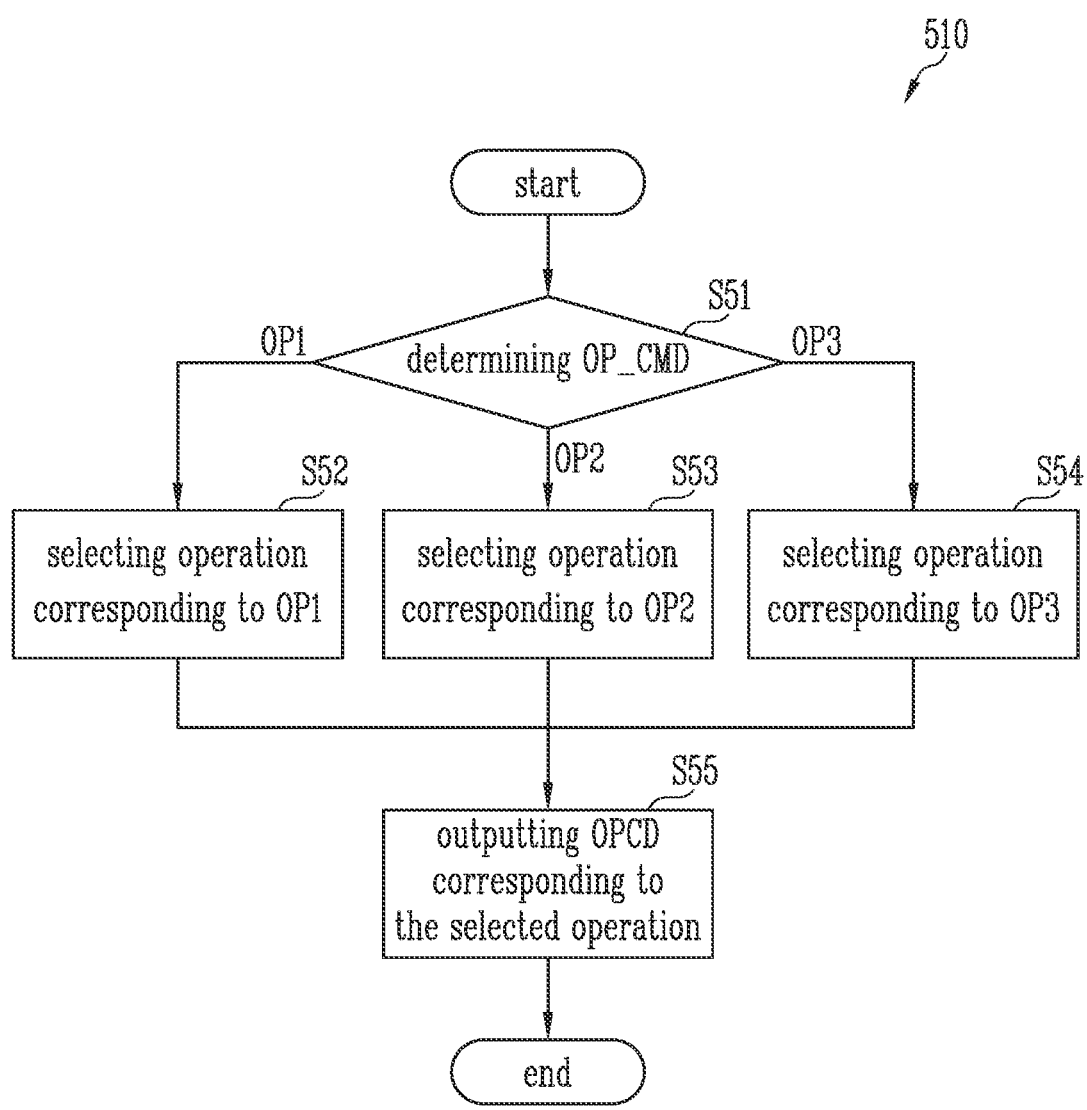
FIG. 7 is a diagram, illustrating a method of operating a control logic, according to an embodiment of the present disclosure.

FIG. 7 is a diagram, illustrating a method of operating the control logic, according to an embodiment of the present disclosure.

Referring to FIG. 7, when the operation command OP_CMD is input, the control logic 510 of FIG. 6 may determine the operation that corresponds to the input operation command OP_CMD (step S51). When it is determined that the input operation command OP_CMD is a command for a first operation OP1, the control logic 510 may select an operation that corresponds to the first operation OP1 (step S52). When it is determined that the input operation command OP_CMD is a command for a second operation OP2, the control logic 510 may select an operation that corresponds to the second operation OP2 (step S53). When it is determined that the input operation command OP_CMD is a command for a third operation OP3, the control logic 510 may select an operation that corresponds to the third operation OP3 (step S54).

Subsequently, the control logic 510 may output the operation code OPCD that corresponds to the selected operation (S55). In FIG. 7, only the first to third operations OP1 to OP3 are disclosed, but since the flowchart that is shown in FIG. 7 is a diagram to help understand the present embodiment, more operations may be included. The operation code OPCD may include a plurality of bits and may include different codes based on the selected operation.

Figure 8:
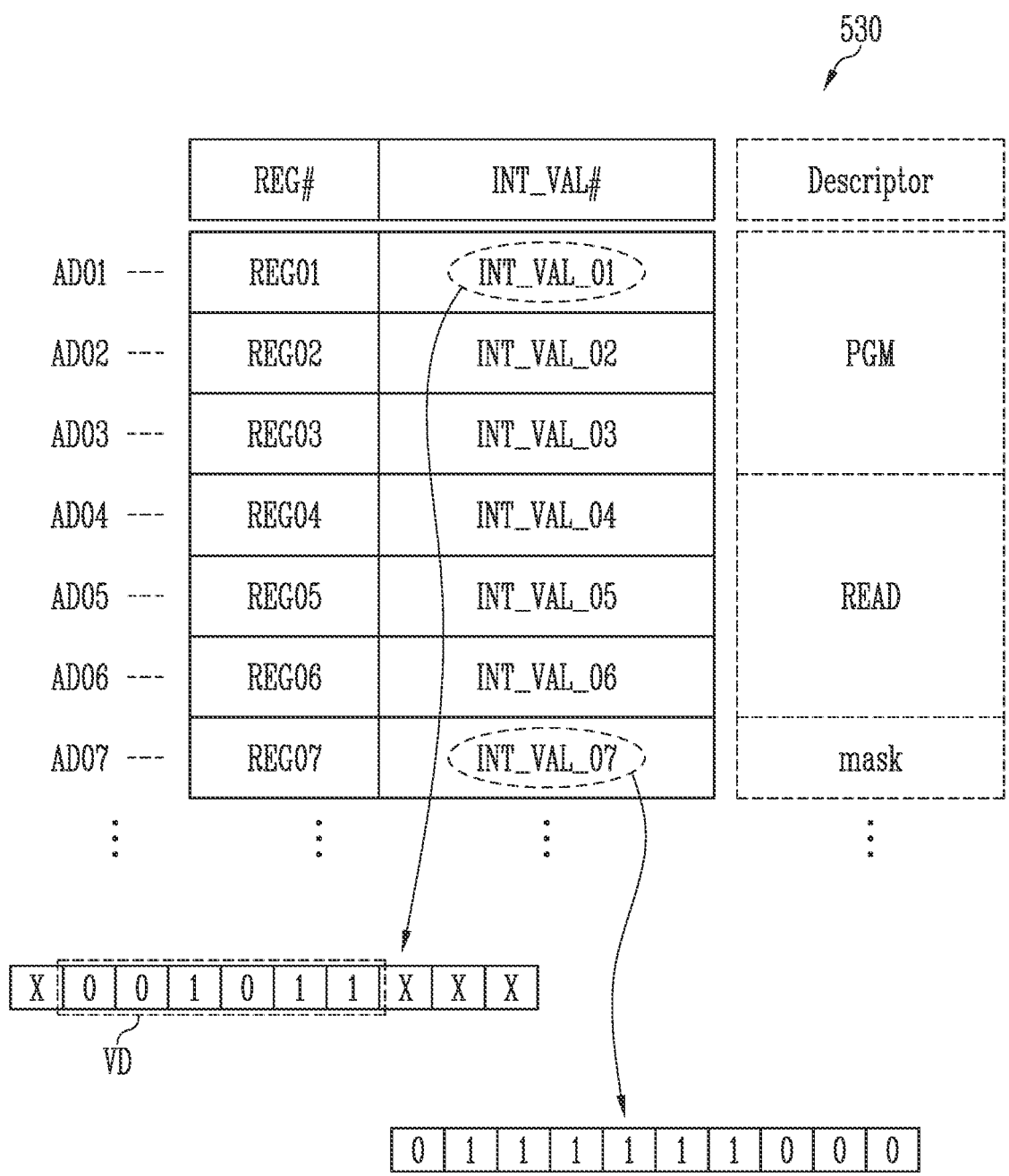
FIG. 8 is a diagram, specifically illustrating a register group, according to an embodiment of the present disclosure.
Figure 9:
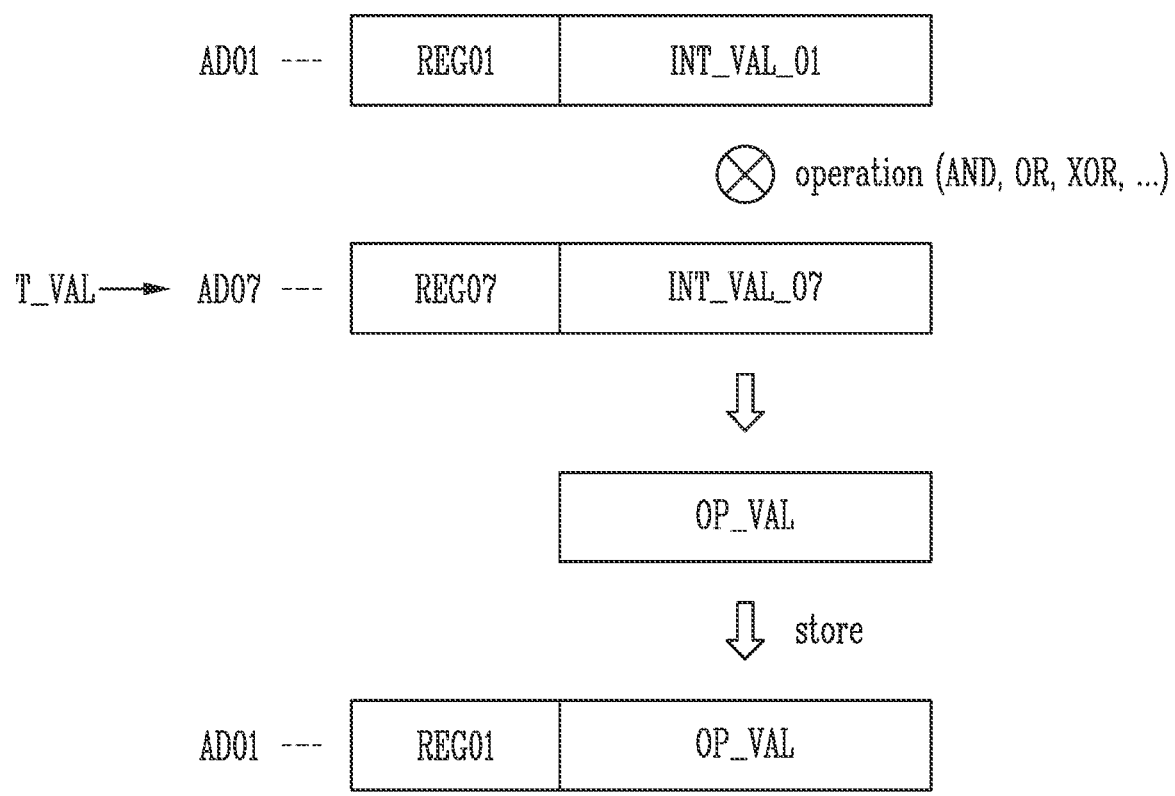
FIG. 9 is a diagram, illustrating a method of operating values that are stored in registers, according to an embodiment of the present disclosure.

FIG. 8 is a diagram, specifically illustrating the register group, according to an embodiment of the present disclosure, and FIG. 9 is a diagram, illustrating a method of operating values that are stored in the registers, according to an embodiment of the present disclosure.

Referring to FIG. 8, the register group 530 may include a register REG# in which an initial setting value INT_VAL# is stored. For example, the register REG# may include a plurality of registers REG01, REG02, . . . . Different addresses AD01, AD02, . . . may be allocated to the plurality of registers REG01, REG02, . . . , respectively. For example, a first address AD01 may be allocated to the first register REG01, and a first initial setting value INT_VAL_01 for any one of a plurality of setting values of a program PGM operation may be stored. In such a method, first to third initial setting values INT_VAL_01 to INT_VAL_03 that are related to the program PGM operation may be stored in the first to third registers REG01 to REG03, and fourth to sixth initial setting values INT_VAL_04 to INT_VAL_06 that are related to a READ operation may be stored in the fourth to sixth registers REG04 to REG06. The seventh register REG07 may store a seventh initial setting value INT_VAL_07 that corresponds to mask data that may be used as a variable in the operation. Each of the first to seventh registers REG01 to REG07 may have a capacity that is capable of storing a plurality of bits. For example, when each of the first to seventh registers REG01 to REG07 has a capacity of 10 bits, the first initial setting value INT_VAL_01 of 10 bits may be stored in the first register REF01, or the first initial setting value INT_VAL_01 in which some bits among 10 bits are used as valid data VD may be stored. The seventh initial setting value INT_VAL_07 that may be used as the mask data may be set based on the valid data VD that is stored in other registers. For example, when the valid data VD that is stored in the first to sixth registers REG01 to REG06 is 6 bits, the seventh initial setting value INT_VAL_07 may also include a valid value 1 that corresponds to the bit in which the valid data VD is stored. At this time, an invalid value that corresponds to the remaining bits may be 0.

Referring to FIG. 9, when the address ADD of FIG. 6 that is input to the operating component 520 of FIG. 6 is an address that is allocated to the first register REG01, the operating component 520 may receive the first initial setting value INT_VAL_01 that is stored in the first register REG01 from the register group 530 of FIG. 8 and may perform the operation based on the first initial setting value INT_VAL_01 and the test value T_VAL. For example, assuming that an address corresponding to the test value T_VAL is a seventh address AD07, the operating component 520 may generate the operation value OP_VAL by performing an operation on first and seventh initial setting values INT_VAL_01 and IVT_VAL_07, which are stored in the first and seventh registers REG01 and REG07. The operation that is performed by the operating component 520 may be logical operations (AND, OR, XOR, . . . ) that are executed based on the operation code OPCD. For example, when the operation code OPCD is a code that executes the AND operation, the operating component 520 may generate the operation value OP_VAL by performing the AND operation on the first and seventh initial setting values INT_VAL_01 and IVT_VAL_07. As another example, when the operation code OPCD is a code that executes the OR operation, the operating component 520 may generate the operation value OP_VAL by performing the OR operation on the first and seventh initial setting values INT_VAL_01 and IVT_VAL_07. Alternatively, the operating component 520 may perform an operation, such as an addition, subtraction, division, or multiplication operation, by using a plurality of arithmetic operations. When the operation value OP_VAL is generated, the operating component 520 may transmit the operation value OP_VAL to the register group 530. The register group 530 may store the operation value OP_VAL that is output from the operating component 520 in the first register REG01. That is, the first initial setting value INT_VAL_01 that is stored in the first register REG01 may be changed to the operation value OP_VAL. Therefore, the operation value OP_VAL that is stored in the first register REG01 may be used in the normal operation that is performed after the test operation is completed.

Figure 11:
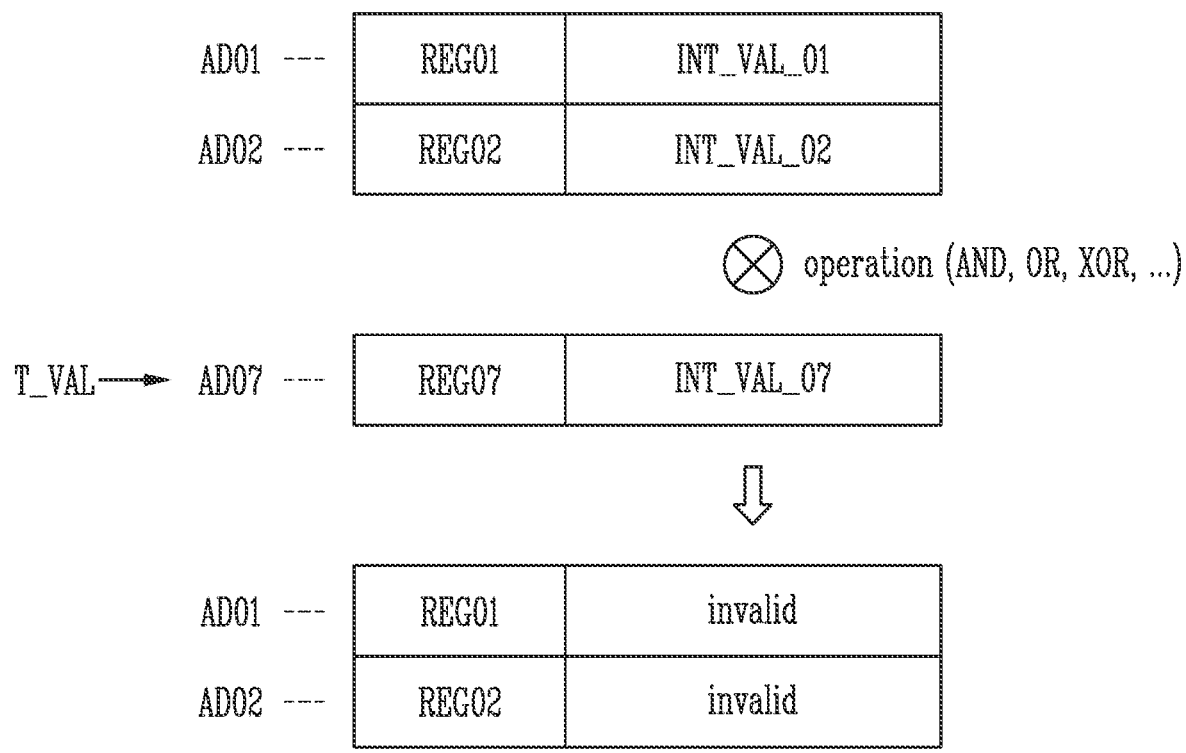
FIG. 11 is a diagram, illustrating a method of operating values that are stored in the registers, according to another embodiment of the present disclosure.

FIG. 10 is a diagram, specifically illustrating the register group, according to another embodiment of the present disclosure, and FIG. 11 is a diagram, illustrating a method of operating values that are stored in the registers, according to another embodiment of the present disclosure.

Referring to FIG. 10, the register group 530 may store a plurality of initial setting values that correspond to the same type. For example, it is assumed that first to sixth initial setting values INT_VAL_01 to INT_VAL_06 that may be used as the start program voltage start Vpgm are stored in the first to sixth registers REG01 to REG06 of the register group 530. The first to sixth initial setting values INT_VAL_01 to INT_VAL_06 may be set to be selected based on an operation condition of the memory device. The seventh initial setting value INT_VAL_07 that corresponds to the mask data may be stored in the seventh register REG07, and eighth to twelfth initial setting values INT_VAL_08 to INT_VAL_12 that is used as the pass voltage Vpass may be stored in the eighth to twelfth registers REG08 to REG12. In addition to the voltage that is shown in FIG. 10, voltages that may be used for operations, such as program, read, or erase may be stored in different registers for each level.

Referring to FIG. 11, some of initial setting values that are stored in the registers may be changed into invalid data through the operation. For example, when the address ADD of FIG. 6 that is input to the operating component 520 of FIG. 6 provides addresses that are allocated to the first and second registers REG01 and REG02, the operating component 520 may receive the first and second initial setting values INT_VAL_01 and INT_VAL_02 that are stored in the first and second registers REG01 and REG02 and may perform the operation based on the first and second initial setting values INT_VAL_01 and INT_VAL_02 and the test value T_VAL. For example, the seventh initial setting value INT_VAL_07 may be set as the invalid data, and an operation value, generated by performing a selected operation with the seventh initial setting value INT_VAL_07, may be set to become invalid data.

That is, when voltages that are not to be used among voltages set as the start program voltage start Vpgm are processed to be invalid based on the result of the test operation of the memory device, the operating component 520 may invalidate the initial setting values that are stored in selected registers by performing the operation by using the address ADD and the test value T_VAL. Alternatively, the operating component 520 may increase or decrease all voltages of a selected type by performing the operation and may increase or decrease some voltages of the selected type. The operation value or the invalid data that is generated by the operating component 520 may be stored in each register of the register group 530.

Figure 12:
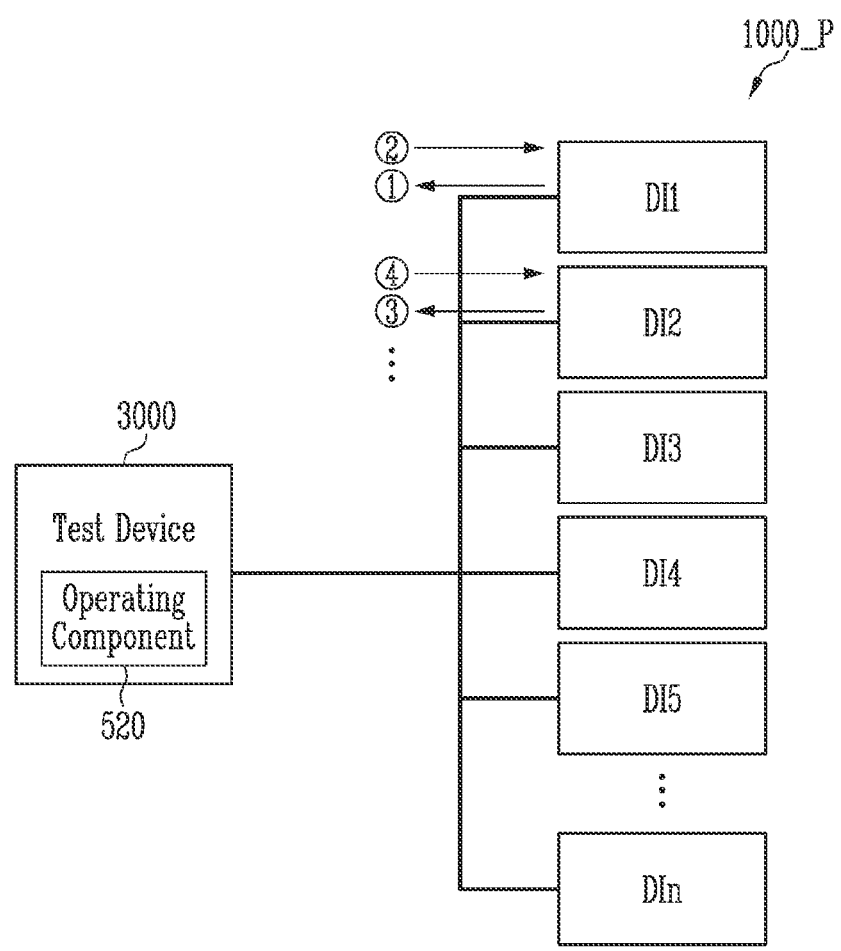
FIG. 12 is a diagram, illustrating a memory system, according to a conventional method.

FIG. 12 is a diagram, illustrating a memory system, according to a conventional method.

Referring to FIG. 12, in a test system 1000_P according to a conventional method, the operating component 520 that is capable of operating the initial setting values based on the result of the test operation of first to n-th dies DI1 to DIn (n is a positive integer) may be included only in a test device 3000. That is, since the operating component 520 that is capable of operating the initial setting values and storing the operation values is not included in the first to n-th dies DI1 to DIn, in order to store test values to the first to n-th dies DI1 to DIn, each of a plurality of read operations and data transmission operations (①, ②, ③, ④, . . . ) may be performed. Here, the die may be the memory device that is shown in FIG. 1. For example, when an operation that changes the initial setting values that are stored in each of the first to n-th dies DI1 to DIn is started, the test device 3000 may read the initial setting value from the first die DI1 (①). The test device 3000 may operate the read initial setting value by using the operating component 520 and transmitting the operation value that is generated by the operation to the first die DI1 (②). When the operation value is stored in the first die DI1, the test device 3000 may read the initial setting values from the second die DI2 (③) and may transmit the operation value to the second die DI2 (④). In such a method, when the test device 3000 performs an operation of changing the initial setting value for each of the first to n-th dies DI1 to DIn, the time that is required to complete both of the read operation and the operation value transmission operation for each die may increase. In addition, as the number of dies increases, the time that is required to reflect the operation value on the die may increase.

In contrast, when the above-described embodiment of the present disclosure is applied, the operation time of the test system may be shortened.

Figure 13:
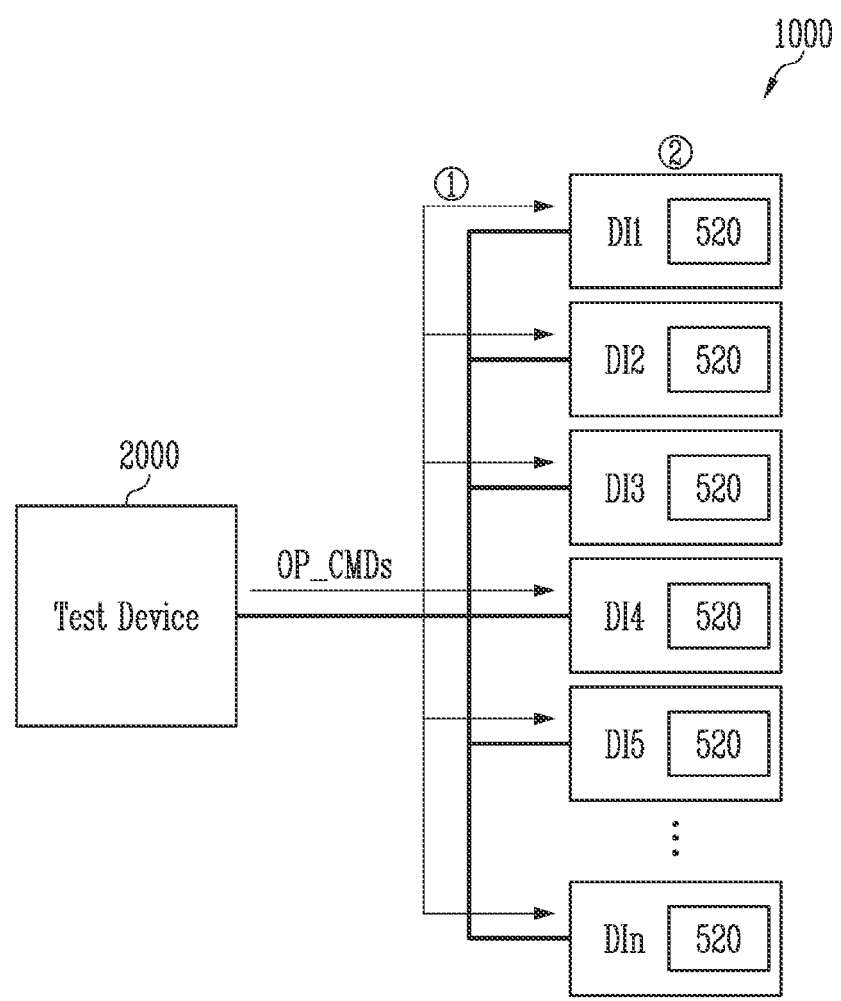
FIGS. 13 and 14 are diagrams, illustrating a method of operating the test system, according to an embodiment of the present disclosure.
Figure 14:
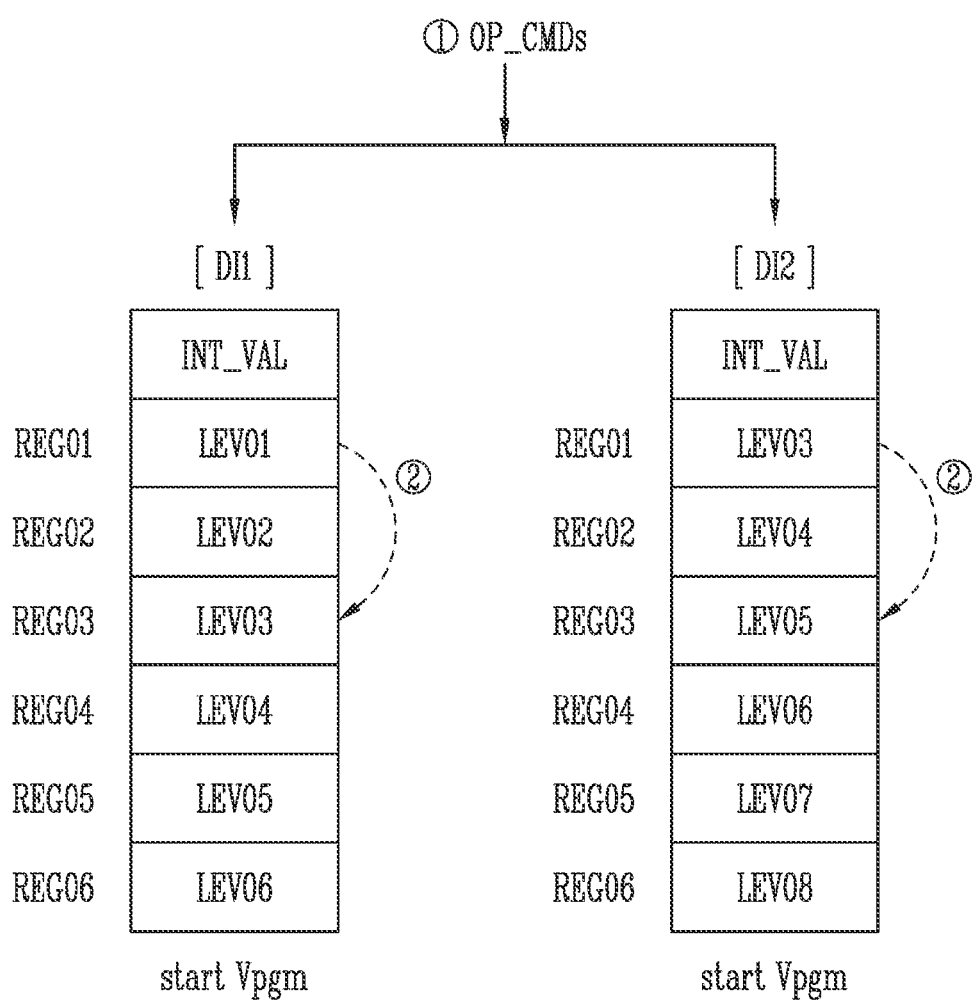

FIGS. 13 and 14 are diagrams, illustrating a method of operating the test system, according to an embodiment of the present disclosure.

Referring to FIG. 13, in the test system 1000 according to the present embodiment, since the operating component 520 is included in each of the first to n-th dies DI1 to DIn, a read operation and an operation value transmission operation may be omitted, and thus, the operation time of the test system may be shortened. For example, when the test device 2000 outputs the operation command set OP_CMDs, the operation command set OP_CMDs may be simultaneously transmitted to the first to n-th dies DI1 to DIn (①). Subsequently, each of the first to n-th dies DI1 to DIn may perform the operation by using the operating component 520 based on the operation command set OP_CMDs and may store the operation value generated by the operation (②). Therefore, according to the present embodiment, since the initial setting values that are stored in the respective first to n-th dies DI1 to DIn are simultaneously operated inside the first to n-th dies DI1 to DIn and the operated values are simultaneously stored, the operation time of the test system 1000 may be shortened.

In addition, even though the initial setting values that are stored in the first to n-th dies DI1 to Din are the same type, different values may be set based on the die. In this case, even in a case where the initial setting value that is stored in different dies is constantly changed, each of the dies may simultaneously change the initial setting values based on the operation command set OP_CMDs.

Referring to FIG. 14, the start program voltage start Vpgm that corresponds to first to sixth levels LEV01 to LEV06 may be stored as the initial setting value in the first to sixth registers REG01 to REG06 of the first die DI1. In contrast, the start program voltage start Vpgm that corresponds to third to eighth levels LEV03 to LEV08 may be stored as the initial setting value in the first to sixth registers REG01 to REG06 of the second die DI2. As described above, when the initial setting values that are stored in the first and second dies DI1 and DI2 are different from each other, the first and second dies DI1 and DI2 may simultaneously receive the operation command set OP_CMDs and may perform the operation. The initial setting value may be changed from a value that is stored in the first register REG01 to a value that is stored in the third register REG03 by performing the operation based on the address and the test value that is included in the operation command set OP_CMDs. That is, the third level LEV03 that is stored in the third register REG03 may be set as the start program voltage start Vpgm in the first die DI1, and the fifth level LEV05 that is stored in the third register REG03 may be set as the start program voltage start Vpgm in the second die DI2.

Figure 15:
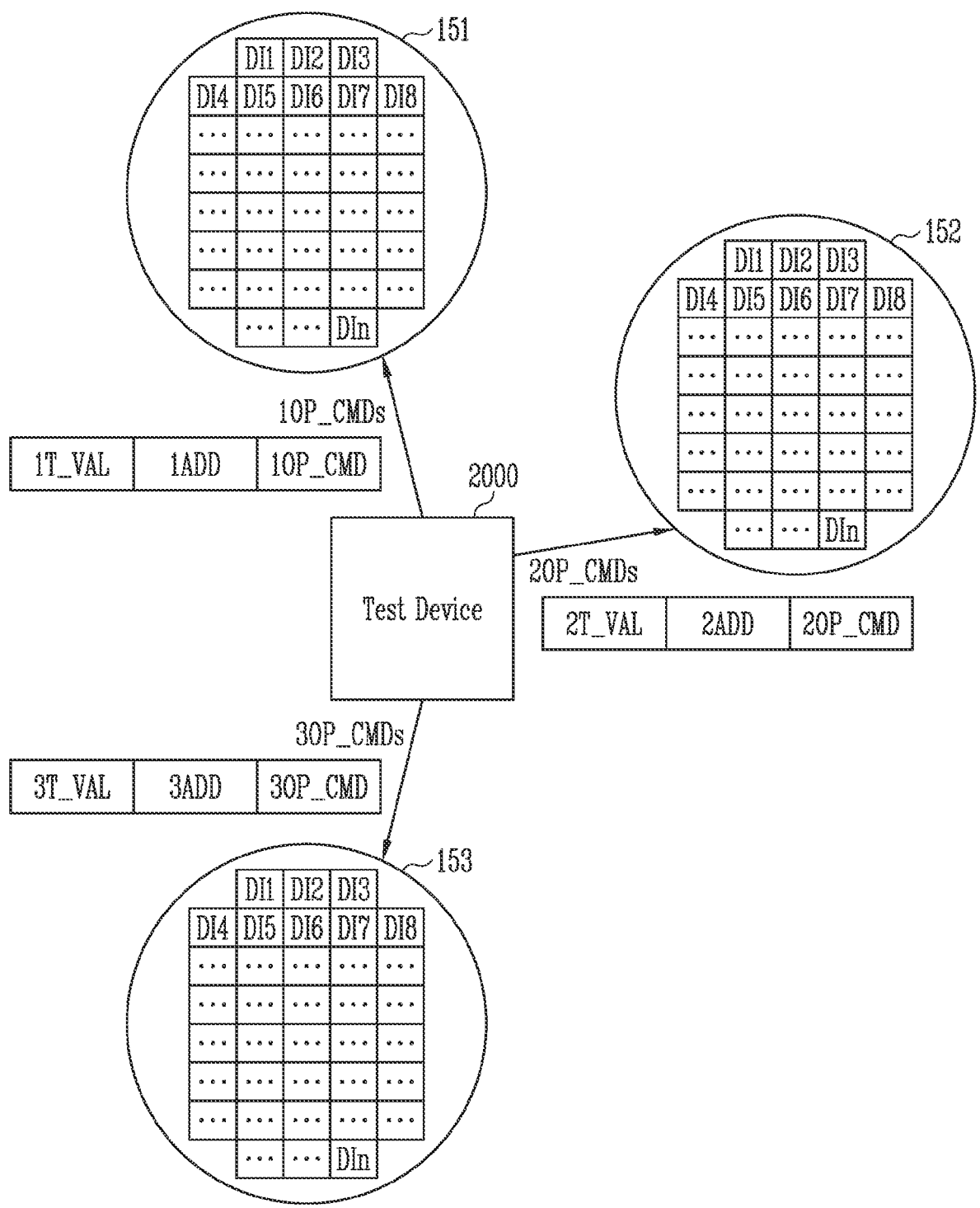
FIG. 15 is a diagram, illustrating a method of reflecting test result values on dies, manufactured in different wafers.

FIG. 15 is a diagram, illustrating a method of reflecting test result values on dies, manufactured in different wafers.

Referring to FIG. 15, when the initial setting values of the dies DI1 to DIn that are manufactured in the different wafers 151, 152, and 153 are changed, the test device 2000 may transmit different operation command sets to the dies DI1 to DIn for each wafer. That is, when the test results of the three different wafers 151, 152, and 153 are different, the test device 2000 may output the different operation command sets to simultaneously change the initial setting values of the dies that are manufactured in each wafer for each wafer.

For example, when the test results of the dies DI1 to DIn that are manufactured in each of the first to third wafers 151 to 153 are different from each other, the test device 2000 may transmit a first operation command set 1OP_CMDs to the dies DI1 to DIn that are manufactured in the first wafer 151, may transmit a second operation command set 2OP_CMDs to the dies DI1 to DIn that are manufactured in the second wafer 152, and may transmit a third operation command set 3OP_CMDs to the dies DI1 to DIn that are manufactured in the third wafer 153.

Each of the first to third operation command sets 1OP_CNDs to 3OP_CMDs may include the operation command OP_CMD, the address ADD, and the test value T_VAL. At least one or more of the operation command OP_CMD, the address ADD, and the test value T_VAL that are included in the different operation command sets may have different values. For example, the test device 2000 may output the first command set 1OP_CMDs with a first operation command 1OP_CMD, a first address 1ADD, and a first test value 1T_VAL to increase the initial setting value of the start program voltage by 2V in the dies DI1 to DIn that are included in the first wafer 151, may output the second command set 2OP_CMDs with a second operation command 2OP_CMD, a second address 2ADD, and a second test value 2T_VAL to decrease the initial setting value of the pass voltage by 0.5V in the dies DI1 to DIn that are included in the second wafer 152, and may output the third command set 3OP_CMDs with a third operation command 3OP_CMD, a third address 3ADD, and a third test value 3T_VAL to decrease the initial setting value for a time in which the program voltage is applied to the word line by 0.5 ms in the dies DI1 to DIn that are included in the third wafer 153.

The first to third operation command sets 1OP_CNDs to 3OP_CMDs that are shown in FIG. 15 are embodiments to help understanding of the present disclosure, and thus, the first to third operation command sets 1OP_CNDs to 3OP_CMDs may be used in various methods in the test operation of changing various initial setting values.

Figure 16:
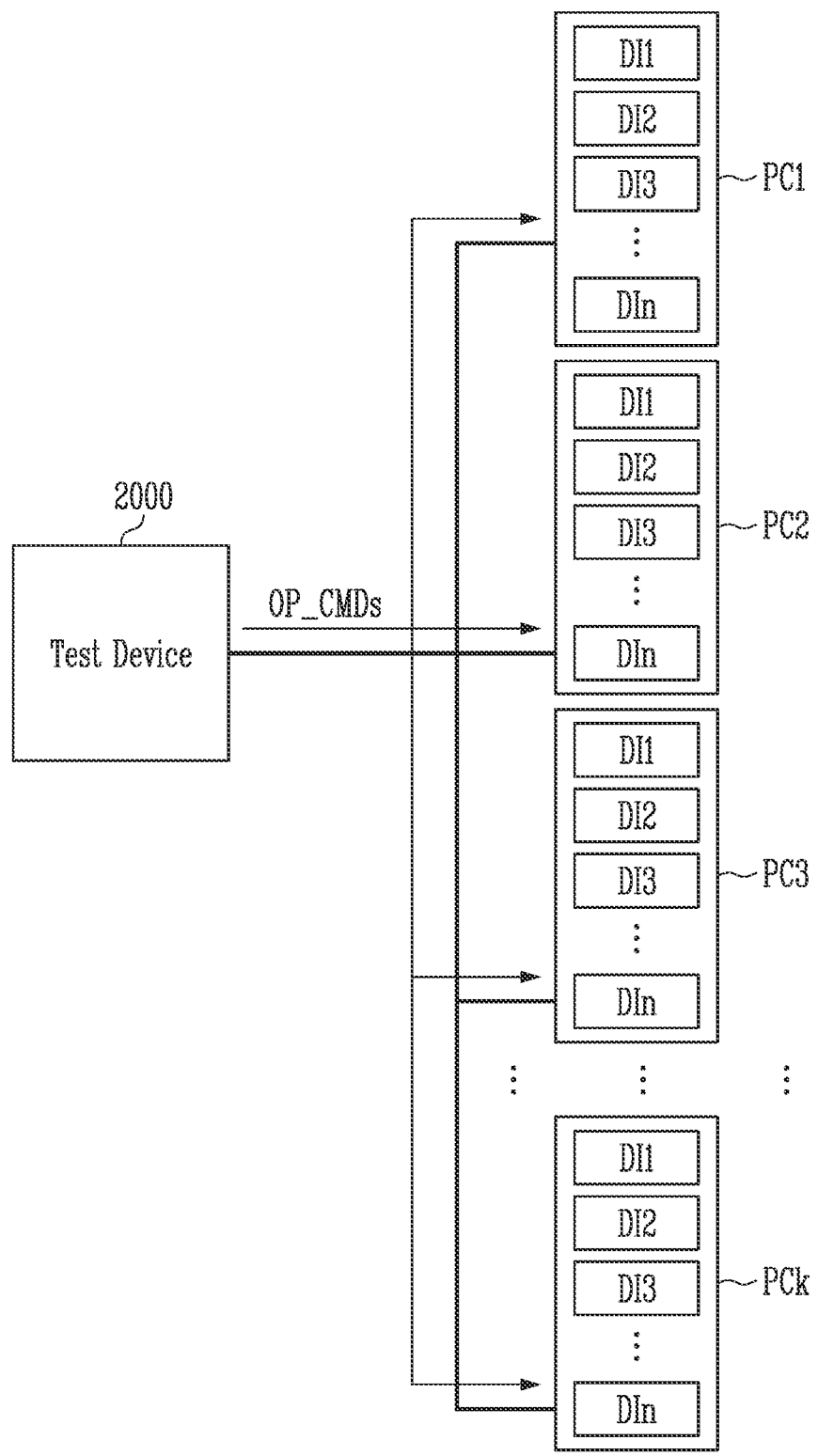
FIG. 16 is a diagram, illustrating a method of reflecting the same test result value on different package chips.

FIG. 16 is a diagram, illustrating a method of reflecting the same test result value on different package chips.

Referring to FIG. 16, the test device 2000 may transmit the operation command set OP_CMDs to a plurality of packages PC1 to PCk, each including a plurality of dies DI1 to DIn, to change the initial setting value of the plurality of dies DI1 to DIn that are included in each of the plurality of packages PC1 to PCk. For example, when the plurality of dies DI1 to DIn are included in the first package PC1 and the plurality of dies DI1 to DIn are also included in the k-th package PCk, the test device 2000 may selectively transmit the operation command set OP_CMDs only to the first and k-th packages PC1 and PCk based on the result of the test operation, and the initial setting values that are stored in the plurality of dies DI1 to DIn that are included in the first and k-th packages PC1 and PCk may be selectively changed. At this time, the initial setting values of the plurality of dies DI1 to DIn that are included in the unselected second to (k−1)-th packages PC2 to PCk−1 may be maintained.

Figure 17:
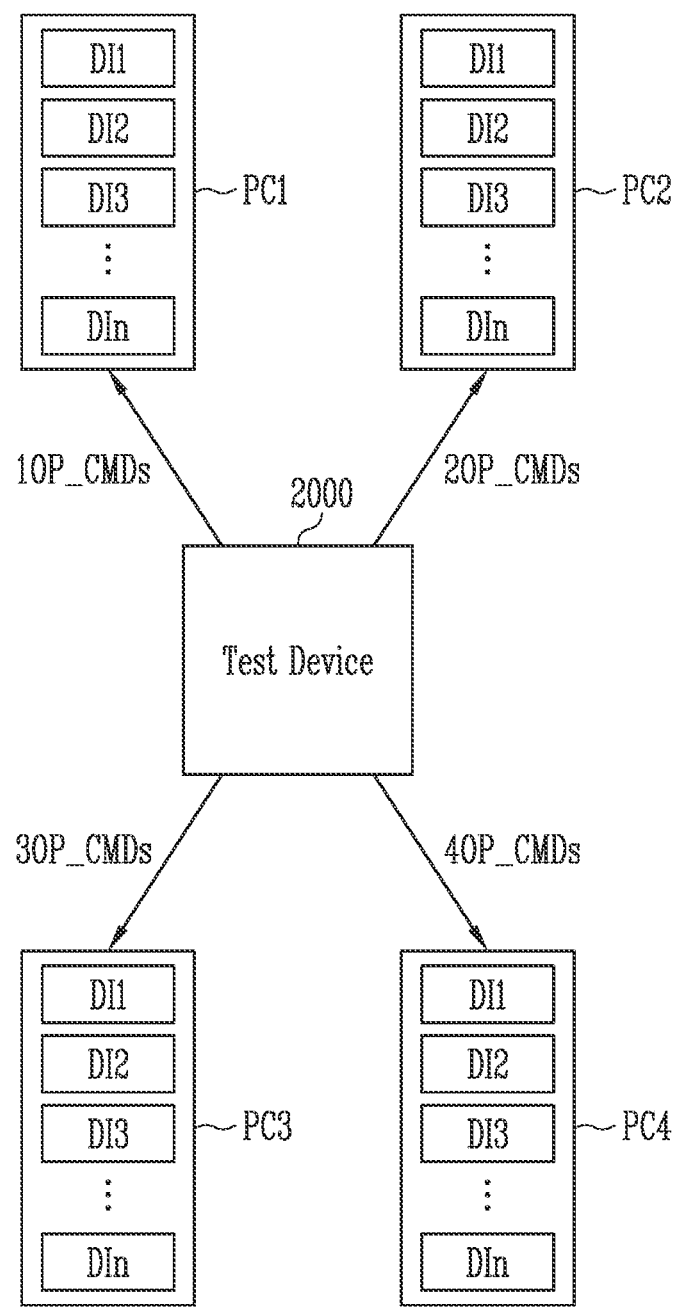
FIG. 17 is a diagram, illustrating a method of reflecting different test result values on different package chips.

FIG. 17 is a diagram, illustrating a method of reflecting different test result values on different package chips.

Referring to FIG. 17, the test device 2000 may apply different test values to different packages PC1 to PC4 based on the test result. That is, when the test results for the different packages PC1 to PC4 are different for each package, the test device 2000 may transmit different operation command sets for each package.

For example, as a result of a test of the first to fourth packages PC1 to PC4, a type of voltage and a change value that changes the initial setting value may be different according to the package. In this case, the test device 2000 may transmit different operation command sets 1OP_CMDs to 4OP_CMDs to each of the first to fourth packages PC1 to PC4.

As described above, according to the present embodiment, the plurality of memory devices may operate the test value and the initial setting value based on the operation command set that is output from the test device 2000, and independently store the operation value that is generated by the operation. Therefore, the time that is required to change the initial setting values that is stored in the plurality of memory devices may be shortened.

What is claimed is:

1. A test system comprising:
   a memory device configured to store an initial setting value for performing normal operations; and
   a test device configured to generate an operation command set including a test value that is a result of a test operation of the memory device, and configured to transmit the operation command set to the memory device,
   wherein the memory device generates an operation value by calculating the initial setting value and the test value in response to the operation command set, replaces the initial setting value with the operation value, and stores the operation value in the memory device.

2. The test system of claim 1, wherein the test device comprises:
   a command generator configured to output an operation command based on the result of the test operation;
   an address selector configured to store, within itself, addresses for setting value type information that corresponds to the initial setting value; and
   a merge circuit configured to output the operation command set by merging the operation command, the address, and the test value.

3. The test system of claim 2, wherein the command generator comprises:
   an operation selector configured to receive a plurality of operation enable signals and configured to output an enable signal that is selected among the operation enable signals; and
   an operation command register configured to store, within itself, operation commands that correspond to a plurality of selected enable signals in a table.

4. The test system of claim 3, wherein the operation command register outputs the operation command to perform a logical operation that corresponds to the selected enable signal.

5. The test system of claim 2, wherein the setting value type information includes a start program voltage, a step voltage, a pass voltage, a read voltage, and an erase voltage.

6. The test system of claim 1, wherein the memory device is configured to perform a logical operation, including an AND, an OR, or an XOR operation, or configured to perform an arithmetic operation, including an addition, a subtraction, a multiplication, or a division operation.

7. The test system of claim 1, wherein the memory device comprises:
a memory cell array configured to store data;
a voltage generator configured to output operation voltages through word lines that are connected to a plurality of memory cells that are included in the memory cell array;
a read write circuit configured to sense data of the memory cells through bit lines that are connected to the memory cells;
an input output circuit configured to receive the operation command set; and
a control circuit configured to calculate the initial setting value and the test value, generate the operation value, replace the initial setting value with the operation value, and store the operation value.

8. The test system of claim 7, wherein the control circuit comprises:
a register group configured to store a plurality of initial setting values, including the initial setting value;
a control logic configured to output an operation code based on an operation command that is included in the operation command set; and
an operating component configured to, based on the operation code, output the operation value by operating the initial setting value, corresponding to an address that is included in the operation command set, and a test value that is included in the operation command set.

9. The test system of claim 8, wherein the register group includes a plurality of registers in which addresses are respectively allocated and different initial setting values are respectively stored.

10. The test system of claim 9, wherein the register group transmits the initial setting value, stored in a register that corresponds to the address, to the operating component and stores the operation value in the register that corresponds to the address when receiving the operation value from the operating component.

11. The test system of claim 1, wherein the memory device is configured to perform normal operations based on the operation value.

12. A test system comprising:
a command generator configured to output an operation command based on different operation enable signals;
an address selector configured to output an address of a register in which an initial setting value to be changed is stored; and
a merge circuit configured to output an operation command set including the operation command, the address, and a test value which is a result of a test operation of a memory device, when the test values is received,
wherein the memory device configured to generate an operation value by calculating the initial setting value and the test value based on the operation command set and configured to replace the initial setting value stored in the register with the operation value.

13. The test system of claim 12, wherein the command generator comprises:
an operation selector configured to receive the operation enable signals and configured to output an enable signal that is selected among the operation enable signals; and
a command register configured to store a table in which operation commands that correspond to the selected enable signals are stored and configured to output an operation command that corresponds to the selected enable signal.

14. The test system of claim 12, wherein the address selector includes a table in which setting value type information, regarding a type of the initial setting value, and addresses that are respectively allocated to the setting value type information are stored.

15. The test system of claim 14, wherein the setting value type information includes information on a start program voltage, a step voltage, and a pass voltage used for a program operation, information on a read voltage used for a read operation, and information on an erase voltage used for an erase operation.

16. The test system of claim 12, wherein the memory device comprises:
a register group configured to store a plurality of initial setting values, including the initial setting value;
a control logic configured to output an operation code to execute a selected operation based on the operation command that is included in the operation command set; and
an operating component configured to, based on the operation code, operate the initial setting value that corresponds to an address that is included in the operation command set and a test value that is included in the operation command set and configured to output the operation value as the result of the test operation.

17. The test system of claim 16, wherein the register group includes a plurality of registers in which addresses are respectively allocated and different initial setting values are respectively stored.

18. The test system of claim 17, wherein the register group transmits the initial setting value, stored in a register that corresponds to the address, among the plurality of registers, to the operating component, and stores the operation value in the register that corresponds to the address when receiving the operation value from the operating component.

* * * * *